United States Patent [19]
Ootera et al.

[11] Patent Number: 5,146,138
[45] Date of Patent: Sep. 8, 1992

[54] PLASMA PROCESSOR

[75] Inventors: Hiroki Ootera; Mutsumi Tsuda, both of Amagasaki, Japan

[73] Assignee: Mitsubishi Denki Kabushiki Kaisha, Japan

[21] Appl. No.: 817,650

[22] Filed: Jan. 7, 1992

Related U.S. Application Data

[62] Division of Ser. No. 333,042, Apr. 4, 1989.

[30] Foreign Application Priority Data

Apr. 5, 1988 [JP] Japan .................................. 63-82276
Nov. 17, 1988 [JP] Japan ................................ 63-292995

[51] Int. Cl.⁵ .............................................. H05H 1/46
[52] U.S. Cl. ........................... 315/111.21; 315/111.41; 313/231.31; 204/298.38
[58] Field of Search ...................... 315/111.21, 111.41, 315/111.81; 313/231.31; 250/423 R; 204/298.38, 298.01, 192.1

[56] References Cited

U.S. PATENT DOCUMENTS

| | | | |
|---|---|---|---|
| 4,609,428 | 9/1986 | Fujimura | 156/643 |
| 4,713,585 | 12/1987 | Ohno et al. | 315/111.81 |
| 4,718,976 | 1/1988 | Fujimura | 156/643 |
| 4,721,553 | 1/1088 | Saito et al. | 204/192.12 |
| 4,778,561 | 10/1988 | Ghanbari | 156/643 |
| 4,866,346 | 9/1989 | Gaudreau et al. | 315/111.21 |
| 4,877,509 | 10/1989 | Ogawa et al. | 204/298 |
| 4,883,968 | 11/1989 | Hipple et al. | 250/423 R |
| 4,891,095 | 1/1990 | Ishida et al. | 156/643 |
| 4,894,510 | 1/1990 | Nakanishi et al. | 219/121.43 |
| 4,915,979 | 4/1990 | Ishida et al. | 427/39 |
| 4,947,085 | 8/1990 | Nakanishi et al. | 204/298.37 X |
| 4,982,138 | 1/1991 | Fujiwara et al. | 315/111.41 |
| 5,003,152 | 3/1991 | Matsuo et al. | 219/121.59 |
| 5,022,977 | 6/1991 | Matsuoka et al. | 315/111.81 X |

OTHER PUBLICATIONS

Sakamoto, "Measurement of Power Transfer Efficiency From Microwave Field To Plasma Under ECR Condition", Japanese Journal of Applied Physics, vol. 16, No. 11, Nov. 1977, pp. 1993–1998.

Primary Examiner—Eugene R. LaRoche
Assistant Examiner—Do Hyun Yoo
Attorney, Agent, or Firm—Leydig, Voit & Mayer

[57] ABSTRACT

A plasma processor comprising a plasma generation portion in which a plasma is generated by electron cyclotron resonance, a source of a right hand polarized microwave and supplying it to the plasma generation portion, and a plasma reaction portion which accommodates a substrate to be processed with the plasma generated in the plasma generation portion. Owing to the production and supply of the right hand polarized microwaves, almost all of the microwaves injected into the plasma generation portion contribute to the generation of the plasma, to increase plasma density and raise processing speed.

1 Claim, 8 Drawing Sheets

PLASMA PROCESSOR

This application is a division of application Ser. No. 07/333,042, filed Apr. 4, 1989.

BACKGROUND OF THE INVENTION

This invention relates to a plasma processor which is a semiconductor fabrication apparatus, and more particularly to a plasma processor which generates a plasma by electron cyclotron resonance and can effect a uniform plasma process over a large area of a substrate.

Figure 1:
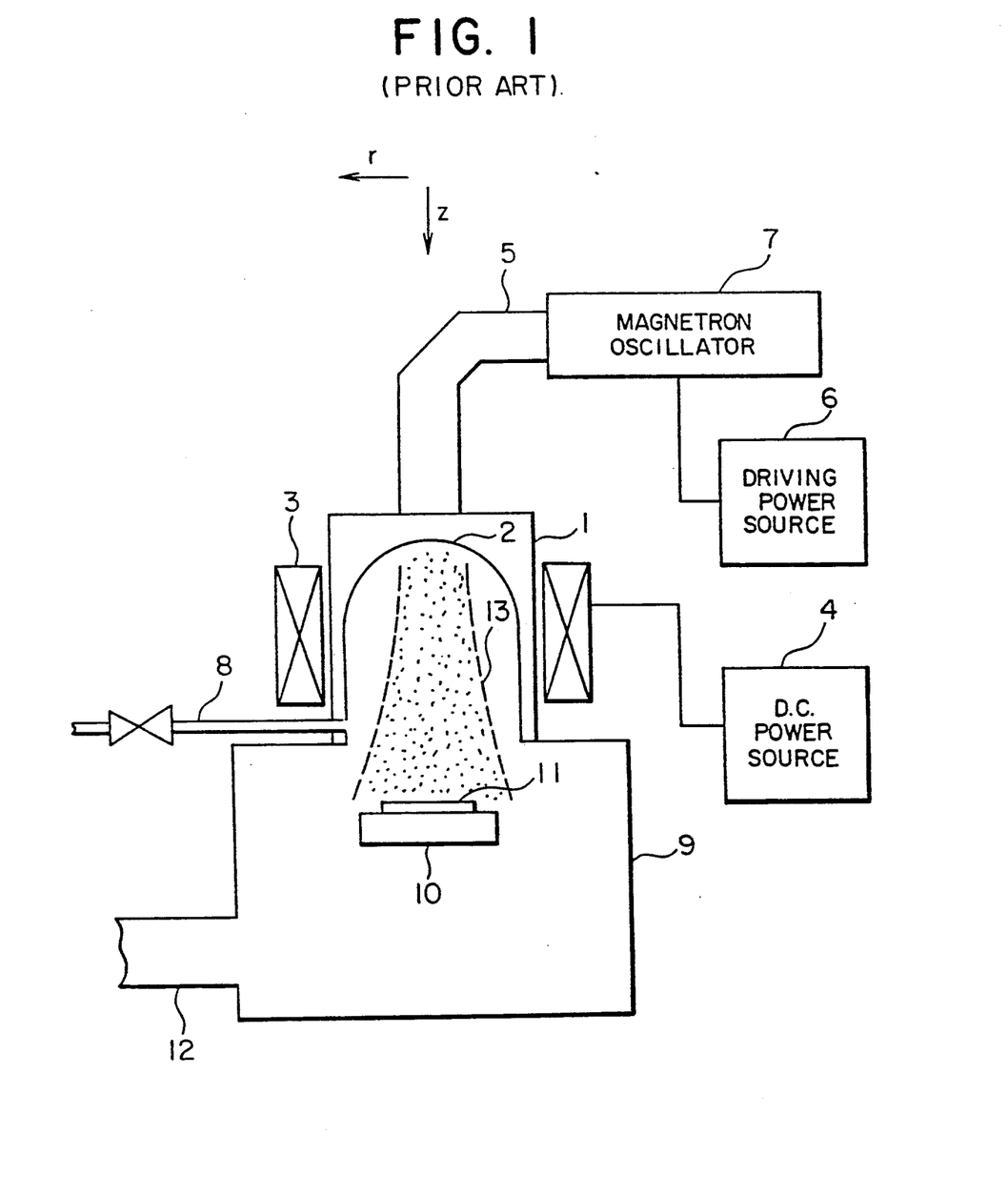
FIG. 1 is a sectional view, partly schematic, showing the construction of a plasma processor in the prior art.

FIG. 1 is a sectional view, partly in schematic, showing the construction of an example of a prior-art plasma processor disclosed in Japanese published patent Application No. 57-79621. The plasma processor comprises a plasma generation portion 1 which generates a plasma by electron cyclotron resonance as described in detail later. This plasma generation portion 1 includes a plasma generating vacuum vessel, for example, glass tube 2 therein. A coil, for example, solenoid coil 3 arranged around the plasma generation portion 1 is electrically connected with a D.C. power source 4 to generate a nonuniform magnetostatic field in the axial direction, namely, z-direction of the plasma processor. A rectangular waveguide 5 which is directly coupled to the plasma generation portion 1 delivers a microwave electric field in the radial direction, namely, r-direction of the plasma processor. A magnetron oscillator 7 which is electrically connected with a driving power source 6 which comprises microwave generation/supply means together with the aforementioned rectangular waveguide 5, magnetron oscillator 7 feeds a linearly-polarized microwave to the rectangular waveguide 5. A gas, for example, reaction gas, is fed to the plasma generating glass tube 2 through a gas supply pipe 8.

The plasma processor further comprises a plasma reaction portion 9. In this plasma reaction portion 9, there is disposed a stage 10 on which a substrate 11 to be processed with the plasma is placed. An exhaust pipe 12 for exhausting the used gas is connected to the lower part of the plasma reaction portion 9.

Figure 2:
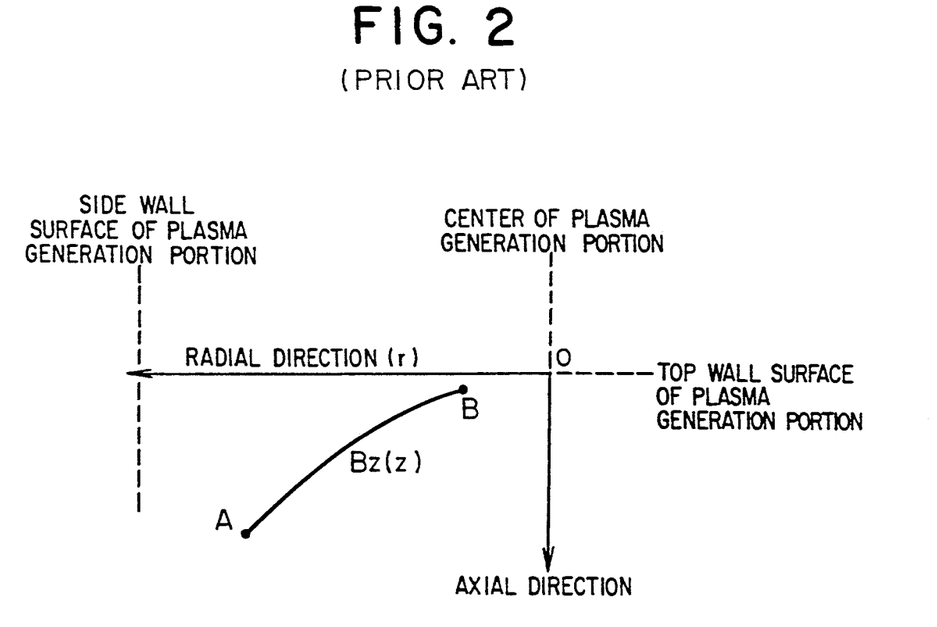
FIG. 2 is a diagram showing a resonance region in the plasma processor illustrated in FIG. 1.

The prior-art plasma processor constructed as stated above, forms the plasma on the basis of electron cyclotron resonance. Therefore, this electron cyclotron resonance will be explained below:

An electron performs a well-known cyclotron motion in the magnetostatic field B, and the angular frequency $\omega_c$ of the cyclotron motion is expressed by $\omega_c = eB/m$ (where e denotes the absolute value of electronic charge, and m denotes the mass of the electron). Letting $\omega$ denote the angular frequency of the microwave electric field E in the plasma generation portion 1, when the cyclotron resonance condition of $\omega = \omega_c$ holds, the energy of the microwave is continuously supplied to the electron, and the energy of the electron increases. FIG. 2 is a diagram showing the resonance region in the radial direction r from the center to the side wall surface of the plasma generation portion 1 and in the axial direction z from the top wall surface to the bottom of the same. A curve from point A to point B is obtained by connecting the points of magnetic field intensities at which the magnetostatic field intensity $B_z(z)$ in the z-direction causes resonance with the microwave electric field E.

Under such cyclotron resonance conditions, a gas of proper pressure is introduced through the gas supply pipe 8. Then, the electrons generated in a preliminary discharge state are continuously supplied with energy from the microwaves, attain a high energy state, and the plasma is developed through the process of collisions between the electrons and gas ions. The microwave energy is further injected into the plasma thus developed, under the resonance conditions.

Accordingly, assuming by way of example that the gas introduced through the gas supply pipe 8 is $SiH_4$, the microwave energy is properly adjusted in conjunction with to the pressure of the gas, whereby the species, concentrations and/or energy levels of respective ions such as $Si^+$, $SiH^+$, $SiH_2+$ and $SiH_3+$ can be controlled, and simultaneously, the species, concentrations and/or energy levels of radicals such as $Si^*$ and $SiH_x^*$ can be controlled.

Meanwhile, an axial force $F_z$ given by the following equation acts on the electrons because of the nonuniform magnetostatic field B(z), so that the electrons are accelerated in the axial direction:

$$F_z = -\mu \frac{dB}{dz} + \frac{\omega_o}{B_o} \cdot \frac{\frac{dB}{dz}}{\left(1 + \frac{m}{M}\right)}$$

where $\mu$ denotes the magnetic moment of an electron, B is the magnetic flux density, z is the distance in the axial direction, $\omega_o$ is the frequency of the circular motion of the electron, $B_o$ is the magnetic flux density in the plasma generation portion 1, m is the mass of the electron, and M is the mass of the gas ions.

Accordingly, the electrons in the plasma generated inside the plasma generation portion 1 in FIG. 1 are axially accelerated toward the plasma reaction portion 9. In consequence, an electrostatic field $E_o(z)$ which accelerates the ions is established in the axial direction within the plasma. This electrostatic field $E_o(z)$ accelerates the plasma as a whole in the axial direction, so that a plasma stream 13 extending in the axial direction appears in the plasma reaction portion 9. Since magnetic lines of forces created by the solenoid coil 3 have radial components in the plasma reaction portion 9, the plasma stream 13 diverges and spreads along the magnetic lines of force.

Such a plasma processor can be applied to various surface processes including plasma etching, plasma CVD and plasma oxidation, and can effectively perform these processes.

With the prior-art plasma processor utilizing the electron cyclotron resonance, the microwaves within the rectangular waveguide are usually linearly-polarized wave. As an electromagnetic propagates in a plasma, however, a clockwise wave component is effective in the generation of the plasma in the processor as stated above. Accordingly, the prior-art processor has had the problem that a counterclockwise component of the microwave having propagating through the rectangular waveguide does not contribute to the generation of the plasma.

Moreover, in the prior-art plasma processor, microwaves are fed through the rectangular waveguide which is directly coupled to the plasma generation portion. Since, however, the cross-sectional area of the plasma generating glass tube is considerably larger than that of the rectangular waveguide, the microwaves entering the plasma generation portion 1 are radiated through an aperture. As a result, the microwave energy density in the radial direction of the plasma generating glass tube is large at the center and feeble near the wall surface. Consequently, the generated plasma is dense at the central part and thin near the wall surface. This has led to the problem that a substrate of large diameter is difficult to process uniformly.

SUMMARY OF THE INVENTION

An object of this invention is to provide a plasma processor in which the electron density in a plasma generation portion is increased, thereby to raising the speed of a plasma process.

Another object of this invention is to provide a plasma processor in which a plasma of uniform density can be generated over an extensive radial range in a plasma generation portion, with the result that a substrate of large diameter can be subjected to a uniform plasma process.

The plasma processor according to this invention is furnished with means for supplying right hand polarized microwaves, in order that the central part of the entering a plasma generation portion may be right hand circular polarized. In this invention, the right hand polarized microwaves are supplied to the plasma generation portion, so that a component which is reflected by a plasma is small, and almost all of the microwave energy produced by a magnetron oscillator is projected into the plasma generation portion. Inside the plasma generation portion, the microwaves impart energy to electrons through electron cyclotron resonance or any other damping mechanism (for example, Landau damping), thereby to increase plasma activity. As a result, the electron density increases, and the speed of the plasma process rises.

In addition, the plasma processor according to this invention is furnished at the inlet part of a plasma generation portion with expansion means for expanding microwaves supplied from a microwave generation/supply means, and means for feeding the vacuum vessel part of the plasma generation portion with the microwaves expanded by the expansion means, so that microwave energy density distribution within the vacuum vessel part may become uniform in the radial direction. In one embodiment of this invention, the expansion means and the means for making the energy density uniform are constructed of two microwave reflectors. These reflectors are shaped to expand the microwaves which are radiated from the inlet part, namely, an aperture antenna, and to make uniform the radial distribution of the energy densities of the microwaves, whereby a plasma which has a large diameter and whose electron densities are substantially uniform in the radial direction is generated in the vacuum vessel part. When this plasma is used for any plasma process, a substrate of large diameter can be uniformly processed.

PREFERRED EMBODIMENTS OF THE INVENTION

Now, embodiments of this invention will be described with reference to the accompanying drawings.

Figure 3:
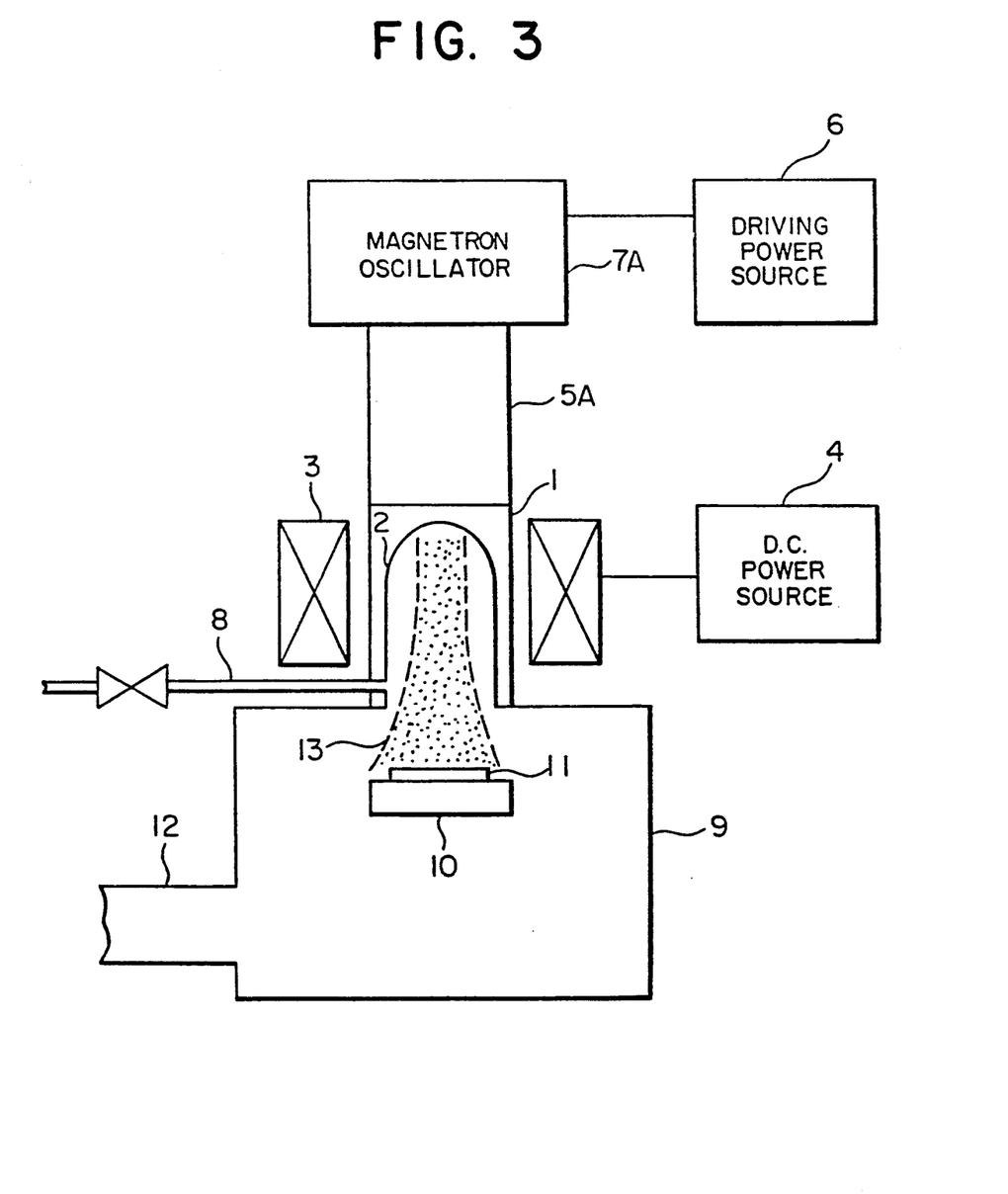
FIG. 3 is a sectional view, partly schematic, showing the construction of an embodiment of this invention.

FIG. 3 is a sectional view, partly, showing the construction of an embodiment of a plasma processor according to this invention. In FIG. 3, constituents indicated by reference numerals 1-4, 6, and 8-13 are the same as those described in FIG. 1, and they shall be omitted from the description. Unlike the magnetron oscillator 7 shown in FIG. 1, a magnetron oscillator 7A which is electrically connected with the driving power source 6, produces right hand polarized microwaves. A circular waveguide 5A, which is interposed between the magnetron oscillator 7A and the plasma generation portion 1, feeds the plasma generation portion 1 with the right hand polarized microwaves generated by the magnetron oscillator 7A. In the embodiment of FIG. 3, the magnetron oscillator 7A and the circular waveguide 5A constitute means for generating and supplying the right hand polarized microwaves.

In the plasma processor constructed as stated above, when the right hand polarized microwaves produced by the magnetron oscillator 7A are introduced into the plasma generation portion 1 through the circular waveguide 5A, the plasma generated within the plasma generation portion 1 takes on a cylindrical shape similar to the shape of the plasma generation portion which is cylindrical. Here, assuming that the plasma in the plasma generation portion 1 is a uniform plasma, only the right hand polarized waves are propagated into the plasma, particularly in the vicinity of the center axis of the plasma generation portion 1. In this embodiment, the microwaves produced by the magnetron oscillator 7A are only the right hand polarized waves, so that the produced microwaves are propagated entirely into the plasma. When the microwaves projected into the plasma reach the region of electron cyclotron resonance, they causes cyclotron resonance, and provide energy to electrons. In this manner, almost all of the microwaves produced by the magnetron oscillator 7A are effectively utilized for heating the electrons. As compared with the prior-art example, therefore, the embodiment increases electron density and can perform a plasma process at high speed. Further, although the circular waveguide 5A connected to the plasma generation portion 1 is shown in FIG. 3 as having a diameter equal to that of the plasma generation portion 1, the diameters need not always be equal. The diameter of the plasma generation portion 1 may well be larger than that of the circular waveguide 5A.

Figure 4:
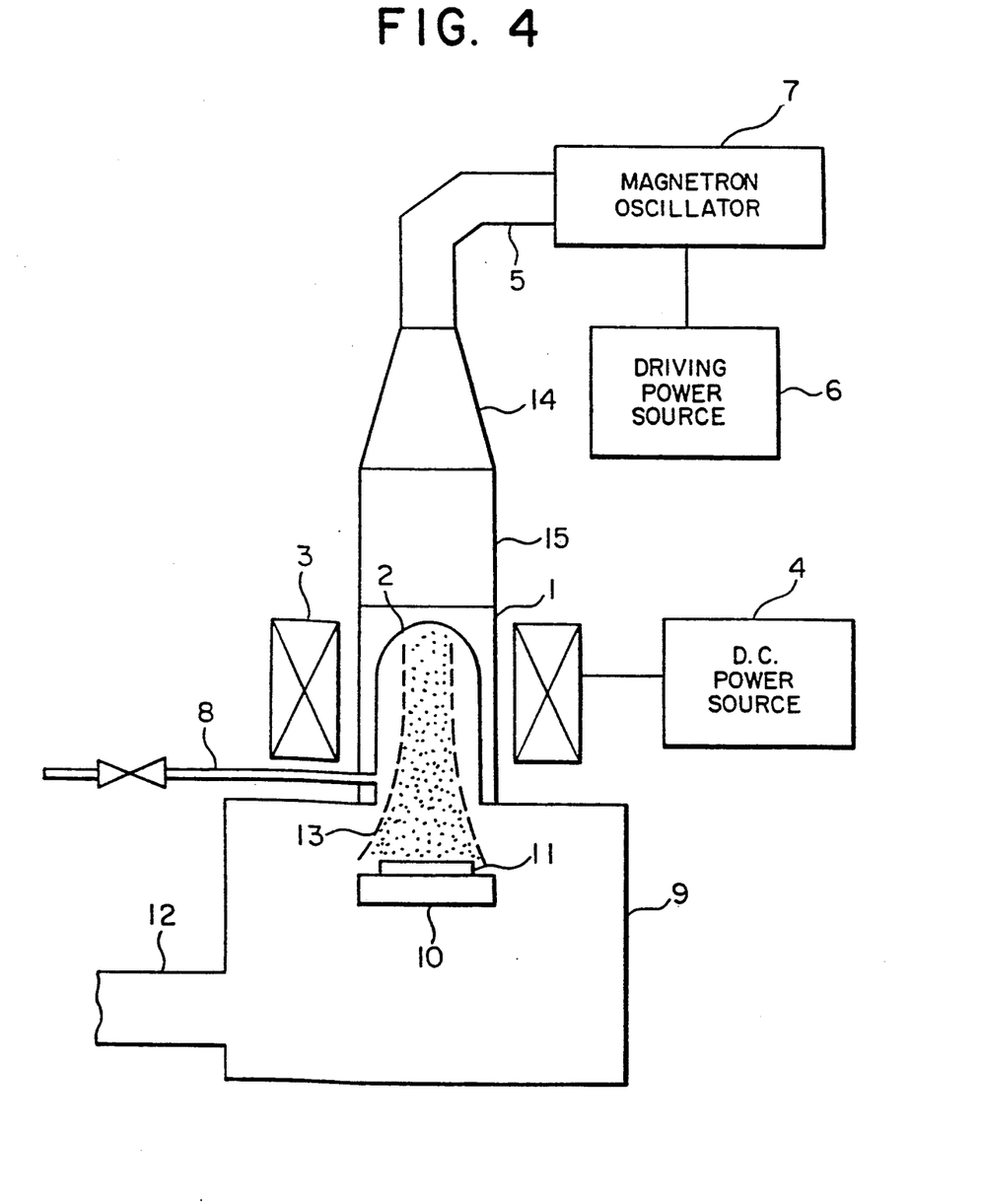
FIG. 4 is a sectional view, partly schematic, showing the construction of a modification of the embodiment illustrated in FIG. 3.

In addition, although the embodiment in FIG. 3 refers to the example in which the magnetron oscillator 7A generates right hand polarized microwaves, it may well be modified as shown in FIG. 4. More specifically, the magnetron oscillator 7 is used for producing linearly-polarized microwaves, and the rectangular waveguide 5 is used for propagating the produced microwaves to an intermediate position. Thereafter, the propagated microwaves are converted into microwaves of circular mode by a rectangular-circular mode converter 14. Further, the microwaves in the circular waveguide are converted into right hand polarized microwaves by a right hand polarized wave generator 15. The right hand polarized microwaves are projected into the plasma generation portion 1.

Figure 5:
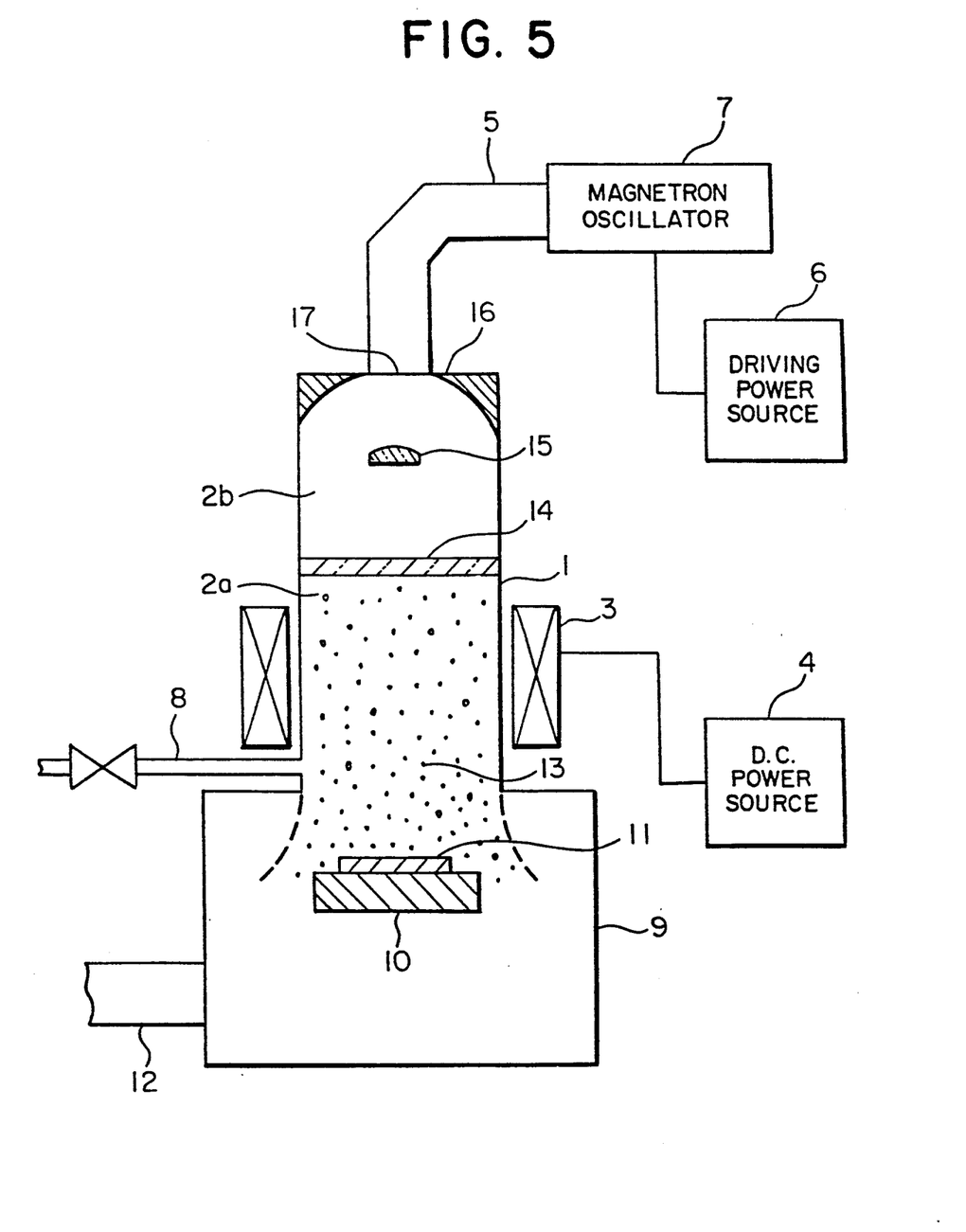
FIG. 5 is a sectional view, partly schematic, showing the construction of another embodiment of this invention.

FIG. 5 is a sectional view, partly in schematic, showing the construction of another embodiment of this invention. In FIG. 5, constituents indicated by reference numerals 1, and 3-13 are the same as those described in FIG. 1, and they are omitted from the description. The plasma generation portion 1 is internally provided with a window 14, dividing it into a vacuum vessel part 2a which holds a vacuum and an inlet part 2b into which microwaves enter from the waveguide 5. A sub reflector 15 for reflecting the microwaves supplied through the waveguide 5 is provided substantially at the center of the inlet part 2b. A main reflector 16 for reflecting the microwaves reflected from the sub reflector 15 and into the vacuum vessel part 2a of the plasma generation portion 1 is provided at the top part of the inlet part 2b.

Figure 6:
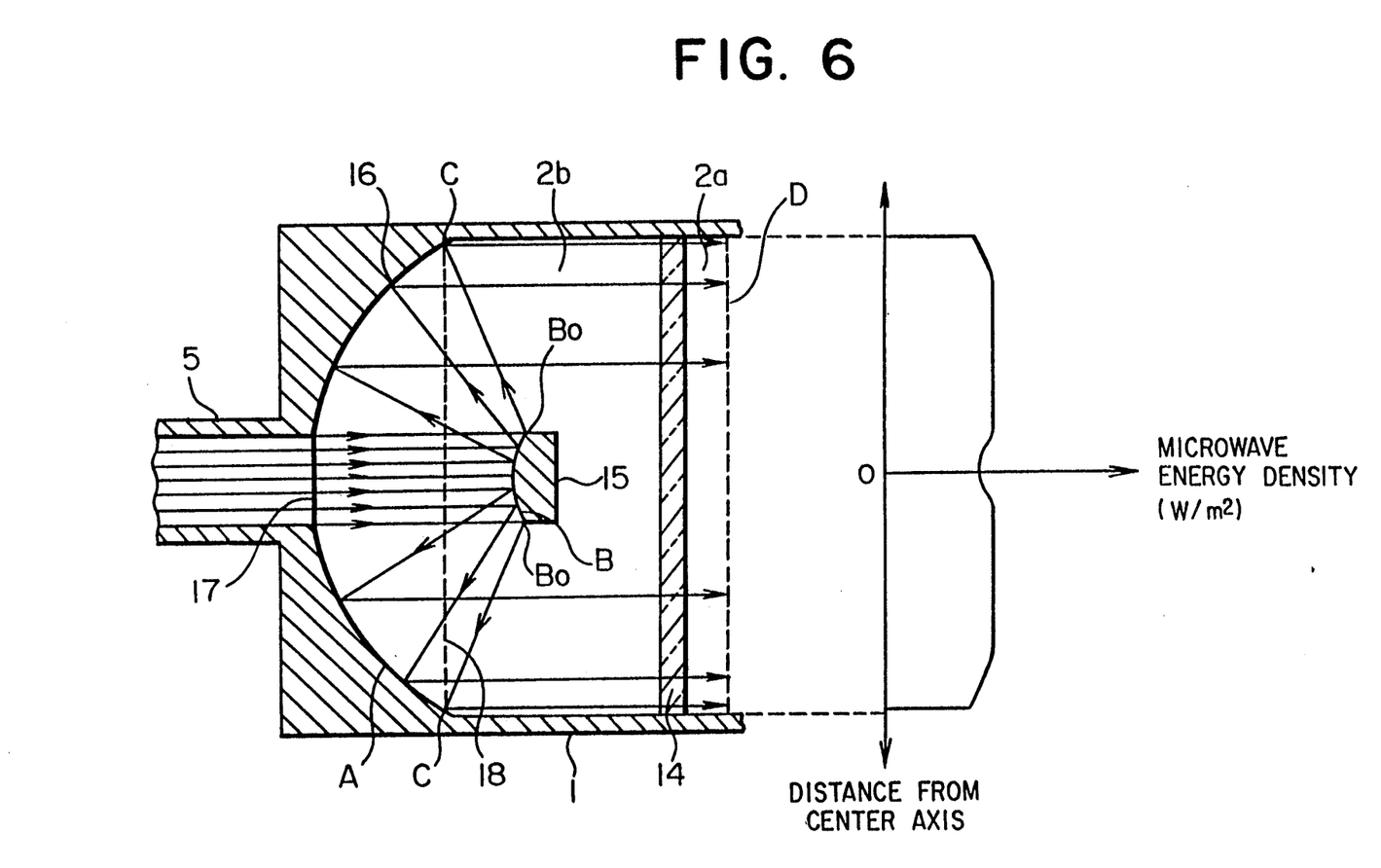
FIG. 6 is a sectional view showing the construction of embodiment illustrated in FIG. 5.

Next, the operation of the plasma processor shown in FIG. 5 will be described. The microwaves produced by the magnetron oscillator 7 are led toward the plasma generation portion 1 through the waveguide 5, and radiated from an aperture 17 into the inlet part 2b. As illustrated in FIG. 6, the radiated microwaves are first reflected by the convex plane of the sub reflector 15 and subsequently reflected by the main reflector 16, and thereby introduced into the vacuum vessel part 2a of the plasma generation portion 1. Here, by appropriately designing the shapes of the main reflector 16 and the sub reflector 15, the energy of the microwaves passing through a unit area (energy density) can be substantially uniformly distributed in the radial direction of the vacuum vessel part 2a as illustrated in FIG. 6.

Figure 7:
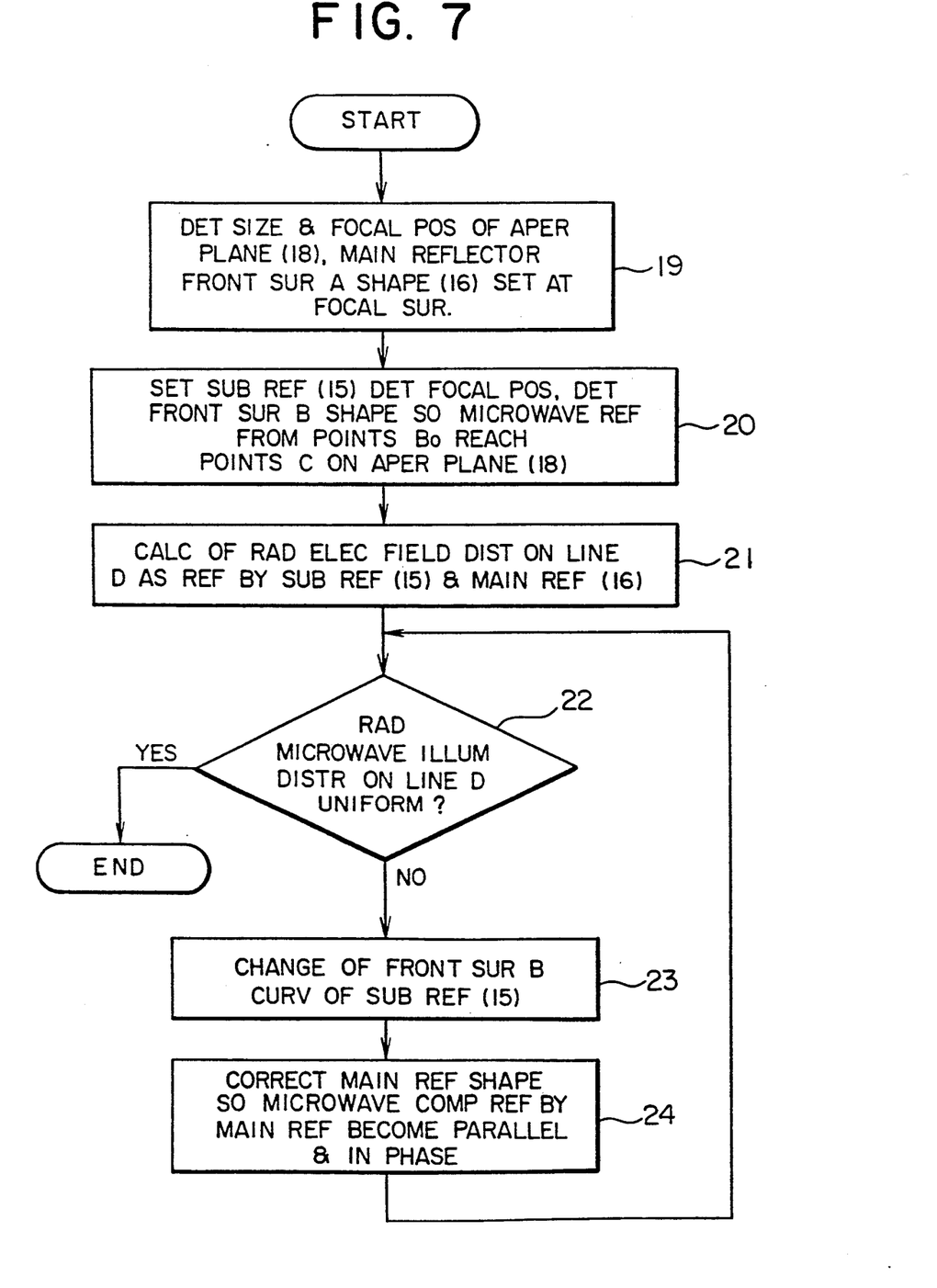
FIG. 7 is a flow chart for of a method of determining the shapes of reflectors in the embodiment illustrated in FIGS. 5 and 6.

FIG. 7 is a flow chart which describes a method of finding the shapes of the reflectors for obtaining uniform microwave energy density. Referring to FIGS. 6 and 7, at the first step 19, the shape of the front surface A of the main reflector 16 is chosen as parabolic, and the size and focal position of an aperture plane 18 for this parabolic reflector are determined. At the next step 20, the sub reflector 15 is situated at the determined focal position, and the shape of the parabolic front surface B of the sub reflector 15 is determined so that the microwaves reflected from points $B_o$ strike corresponding points C on the aperture plane 18. Thereafter, step 21 calculates the distribution of radiant electric fields on a line D as reflected by the sub reflector 15 and the main reflector 16. Step 22 checks whether the illumination distribution of the radiated microwave on the line D is uniform. Unless the illumination distribution is uniform, the curvature of the front surface B of the sub reflector 15 is somewhat changed at step 23 to change the shape of the parabolic surface. More specifically, when the front surfaces of the main reflector 16 and the sub reflector 15 are parabolic, the wave number vector of the microwaves reflected by the main reflector 16 become parallel. However, the illumination distribution of the microwave is not uniform, but is intense at the central part of the vacuum vessel part 2a and feeble at the peripheral part thereof. Therefore, the radius of curvature of the parabolic surface of the sub reflector 15 is somewhat enlarged to intensify the electric field of the peripheral part of the aperture plane 18 of the main reflector 16. Then, the radiated microwaves fail to be parallel. At the ensuing step 24, therefore, the shape of the front surface of the main reflector 16 is corrected so that the microwaves may become parallel and in phase. Thereafter, the flow is returned again to step 22, at which the intensities of the radiant electric fields are calculated to judge whether or not the illumination distribution is uniform. The process described above is repeated until the microwaves becomes parallel and uniform.

As stated before, with the prior-art plasma processor shown in FIG. 1 wherein the rectangular waveguide 5 and the plasma generation portion 1 are directly coupled, the energy density is high at the central part but is low at the peripheral part near the tube wall. Accordingly the electron density of the generated plasma is high at the central part and low at the peripheral part, so that a uniform plasma cannot be obtained. In contrast, with the plasma processor in FIG. 5 according to another embodiment of this invention, the radial distribution of the energy density of the microwaves is uniform, so that a substantially uniform plasma can be generated. In this manner, a plasma which has a large diameter and which exhibits a substantially uniform energy density in the radial direction is generated, whereby a substrate a large diameter can be uniformly processed.

Figure 8:
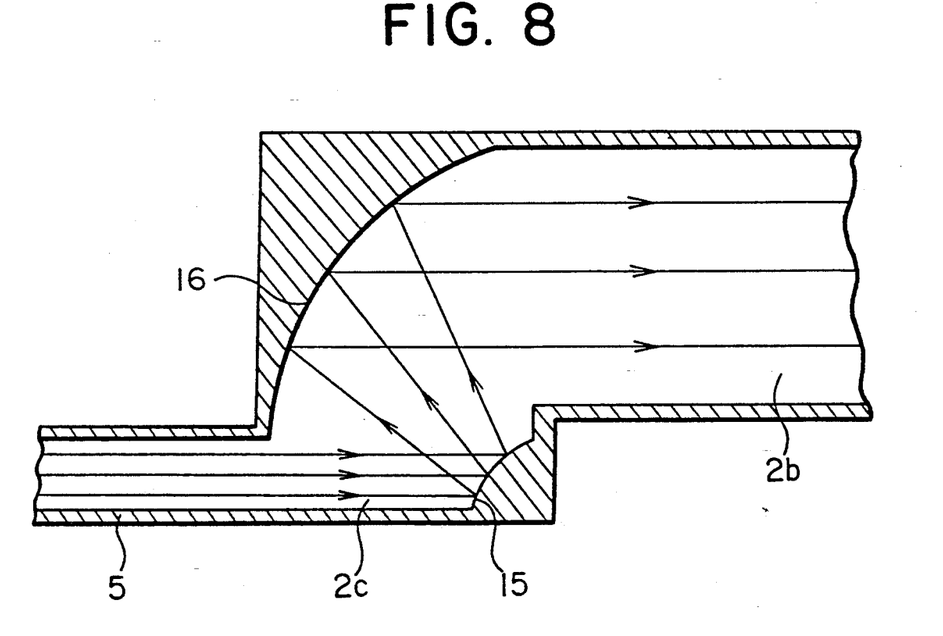
FIGS. 8 and 9 are sectional views each showing the construction of a modification of the embodiment illustrated in FIG. 5.

Incidentally, with the construction shown in FIGS. 5 and 6, the sub reflector 15 lies at a position where it just intercepts the entering microwaves, with the result that the microwave energy density is somewhat lowered on the center axis as illustrated in FIG. 6. In order to prevent this drawback, as shown in FIG. 8, the inlet part 2b is provided with a protrusion 2c, and the sub reflector 15 is provided at the lower part of the protrusion 2c. Then, uniform microwave energy density is attained even on the center axis, whereby the plasma density is made uniform.

Further, in other embodiments described above, the shapes of the reflectors have been determined by calculation. However, if the frequency is high and the vacuum vessel part 2a is sufficiently large (for example, for $\omega = 5$ GHz and a diameter of 1 m), microwaves of substantially uniform energy density can be obtained by designing the shapes of the reflectors similarly to those of optical mirrors.

Figure 9:
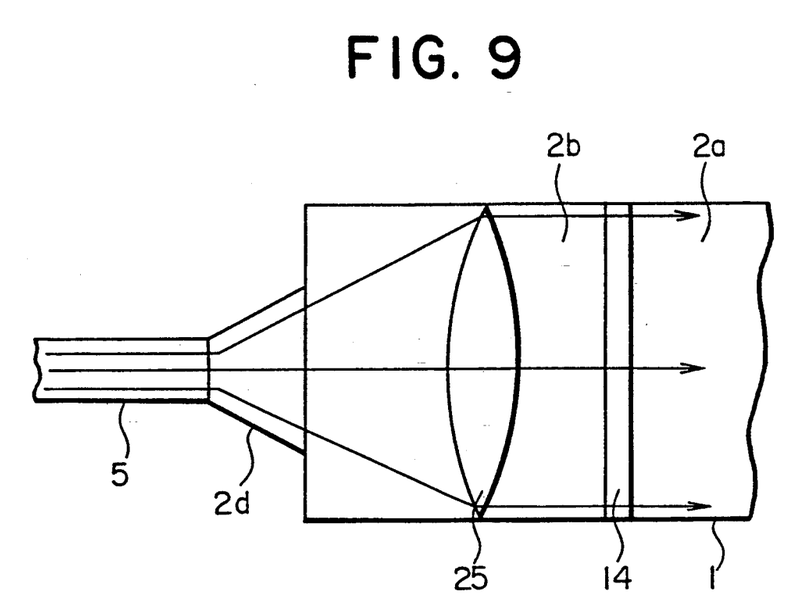

Further, as means for expanding and making the microwave uniform a substance having a lens action may be used to transmit the microwaves without employing the reflectors as stated above. FIG. 9 is a sectional view showing the construction of an embodiment in such a case. The microwaves emergent from the rectangular waveguide 5 are expanded by an expanding part 2d provided between the inlet part 2b and the rectangular waveguide 5, and the microwave energy density distribution in the radial direction is made substantially uniform by a lens 25 provided in the inlet part 2b. The resulting microwaves are introduced into the vacuum vessel part 2a of the plasma generation portion 1. The lens 25 may be any of a metal plate lens, a dielectric lens, a path length lens, etc. described in, for example, "Maikuroha Kogaku (Microwave Engineering)," pp. 168-171.

As described above in detail, according to this invention, means for producing a right hand polarized microwave and supplying it to a plasma generation portion is provided, so that few reflected wave components arise, and almost all incident wave components propagate into a plasma and contribute to the generation of the plasma. Thus, the invention achieves the effects that electron density is increased and that processing speed is raised. Moreover, according to this invention, expansion means for expanding propagating microwaves and means for feeding the vacuum vessel part of a plasma generation portion with the microwave expanded by the expansion means after being made substantially uniform in energy density distribution in the radial direction of the vacuum vessel part are provided at the inlet part of the plasma generation portion, so that the radial density distribution of the plasma generated becomes substantially uniform. Accordingly, the invention achieves the effect that a substrate of large diameter can be uniformly processed.

What is claimed is:

1. A method of determining the shapes of reflecting surfaces of a sub reflector and a main reflector in a plasma processor the plasma processor including a plasma generation portion in which an electron cyclotron resonance plasma is generated, means for producing a magnetic field in the plasma generation portion for establishing the electron cyclotron resonance plasma, means for supplying gas to the plasma generation portion, means for producing microwave energy and for supplying the microwave energy to the plasma generation portion, the plasma generation portion including an inlet part for receiving microwave energy in a vacuum vessel part, the inlet part including expansion means for expanding the microwave energy received from the means for producing microwave energy, means for transmitting the microwave energy from the expansion means to the vacuum vessel part, and means for making substantially uniform the microwave energy density distribution along a radial direction in the vacuum vessel part, the expansion means and the means for making substantially uniform including the sub reflector for reflecting microwave energy from the means for producing microwave energy and the main reflector disposed in the inlet part for reflecting microwave energy into the vacuum vessel part that has been reflected by the sub reflector, the method comprising:

choosing a parabolic surface as a front reflecting surface of the main reflector and determining the size of an aperture plane and a focal position of the main reflector for the chosen parabolic surface;

disposing the sub reflector at the focal position of the main reflector and choosing a parabolic surface as a front reflecting surface of the sub reflector so that microwave energy reflected from an edge of the sub reflector impinges on an edge of the aperture plane;

the distribution of radiant electric fields reflected by the sub reflector and the main reflector along a line perpendicular to incident microwave of examining if an energy to determine whether the distribution of microwave energy is uniform;

if the distribution of microwave energy along the lien is determined not to be uniform, changing the curvature of the front surface of said sub reflector to change the parabolic shape thereof; and changing the shape of the front surface of the main reflector so that components of the microwave energy are parallel and in phase a step of repeating said fourth step through said sixth step until the radiant electrical fields become parallel and uniform.

* * * * *

UNITED STATES PATENT AND TRADEMARK OFFICE
CERTIFICATE OF CORRECTION

PATENT NO. : 5,146,138

DATED : September 8, 1992

INVENTOR(S) : Ootera et al.

It is certified that error appears in the above-identified patent and that said Letters Patent is hereby corrected as shown below: On the title page:

Item no. [56] References Cited, U.S. Patent Documents, change "1/1088" to --1/1988--.

Claim 1, column 8, line 19, before "distribution" insert --calculating--.

Claim 1, column 8, lines 21 and 22, delete "of examining if an".

Claim 1, column 8, line 24, change "lien" to --line--.

Signed and Sealed this

Fourteenth Day of September, 1993

Attest:

BRUCE LEHMAN

*Attesting Officer*   *Commissioner of Patents and Trademarks*